(12) United States Patent
Chow et al.

(10) Patent No.: US 7,612,444 B2
(45) Date of Patent: Nov. 3, 2009

(54) SEMICONDUCTOR PACKAGE WITH FLOW CONTROLLER

(75) Inventors: Seng Guan Chow, Singapore (SG); Oh Sug Kim, Ichon-Si (KR); Byung Tai Do, Singapore (SG)

(73) Assignee: Stats Chippac, Inc., Fremont, CA (US)

( * ) Notice: Subject to any disclaimer, the term of this patent is extended or adjusted under 35 U.S.C. 154(b) by 0 days.

(21) Appl. No.: 11/620,553

(22) Filed: Jan. 5, 2007

(65) Prior Publication Data
US 2008/0164618 A1 Jul. 10, 2008

(51) Int. Cl.
*H01L 23/488* (2006.01)
*H01L 23/48* (2006.01)
*H01L 21/56* (2006.01)

(52) U.S. Cl. .............................. 257/686; 257/E23.023; 257/E21.502; 257/E25.013; 257/E25.023; 257/685; 257/777; 257/723; 257/784; 257/786; 257/737; 257/738; 257/778; 257/780; 257/779; 257/678

(58) Field of Classification Search .................. 257/686, 257/685, 777, 723, 784, 786, 737, 738, 734, 257/778, 779, 780, 772, 678, E23.023, E21.502, 257/E25.013, E25.023, 724, 725, 728; 438/109
See application file for complete search history.

(56) References Cited

U.S. PATENT DOCUMENTS

| | | | |
|---|---|---|---|
| 5,331,205 A | 7/1994 | Primeaux | |
| 5,684,332 A | 11/1997 | Chen et al. | |
| 6,031,281 A | 2/2000 | Kang et al. | |
| 6,083,775 A * | 7/2000 | Huang et al. | 438/118 |
| 6,211,574 B1 | 4/2001 | Tao et al. | |
| 6,309,914 B1 * | 10/2001 | Huang et al. | 438/124 |
| 6,324,069 B1 * | 11/2001 | Weber | 361/783 |
| 6,441,501 B1 | 8/2002 | Tseng et al. | |
| 6,617,201 B2 * | 9/2003 | Chye et al. | 438/125 |
| 6,750,533 B2 | 6/2004 | Wang et al. | |
| 6,955,949 B2 | 10/2005 | Batish et al. | |
| 6,963,142 B2 | 11/2005 | Bolken | |
| 6,969,640 B1 | 11/2005 | Dimaano, Jr. et al. | |
| 2002/0142602 A1 * | 10/2002 | Wensel | 438/690 |
| 2003/0205805 A1 * | 11/2003 | Rumsey | 257/724 |
| 2005/0275091 A1 * | 12/2005 | Boyaud et al. | 257/731 |

OTHER PUBLICATIONS

U.S. Appl. No. 11/521,974, filed Sep. 14, 2006, Chow et al.

(Continued)

*Primary Examiner*—Alexander O Williams (57) ABSTRACT

A semiconductor package can comprise a die stack attached to a substrate, with bond wires electrically connecting the two. Often multiple die stacks are adhered to a single substrate so that several semiconductor packages can be manufactured at once. A molding compound flow controller is optimally associated with the substrate or semiconductor package at one or more various locations. Flow controllers can control or direct the flow of the molding compound during the encapsulation process. Flow controllers can be sized, shaped, and positioned in order to smooth out the flow of the molding compound, such that the speed of the flow is substantially equivalent over areas of the substrate containing dies and over areas of the substrate without dies. In this manner, defects such as voids in the encapsulation, wire sweeping, and wire shorts can be substantially avoided during encapsulation.

32 Claims, 8 Drawing Sheets

OTHER PUBLICATIONS

U.S. Appl. No. 11/532,387, filed Sep. 15, 2006, Cablao et al.
U.S. Appl. No. 11/525,493, filed Sep. 22, 2006, Rajendra D. Pendse.
U.S. Appl. No. 11/595,638, filed Nov. 10, 2006, Rajendra D. Pendse.
U.S. Appl. No. 11/601,103, filed Nov. 17, 2006, Kim et al.
U.S. Appl. No. 11/633,701, filed Dec. 4, 2006, Wang et al.
U.S. Appl. No. 11/608,164, filed Dec. 7, 2006, Rajendra D. Pendse.
U.S. Appl. No. 11/619,563, filed Jan. 1, 2007, Ramakrishna et al.
U.S. Appl. No. 11/620,561, filed Jan. 5, 2007, Park et al.
U.S. Appl. No. 11/672,910, filed Feb. 8, 2007, Taehun Kim.

* cited by examiner

SEMICONDUCTOR PACKAGE WITH FLOW CONTROLLER

FIELD

The disclosure concerns packaging for semiconductors.

BACKGROUND

Manufacturers consistently try to reduce the size of products, such as cellular telephones, computers, and digital cameras in order to meet consumer demands. All of these electronic products require integrated circuit (IC) assemblies. Thus, it is important to continue to reduce the size of these IC assemblies, without sacrificing performance, in order to reduce the overall product size.

IC assemblies may include a plurality of interconnected IC chips, which also are referred to as dies. One or more dies are stacked in a particular location on a substrate surface. The substrate location is referred to as a die attach area. Typically, an array of such die stacks is formed on a substrate, and the die stacks are separated into individual packages along saw lines to form the end-product. For convenience, this specification typically refers to plural dies; however, all statements apply equally to a semiconductor package having only one die.

A die stack is referred to as a single stack if there is a single die stacked in a particular location on the substrate. If plural dies are stacked on top of each other in a particular location on the substrate, the stack is referred to as a multiple stack. A semiconductor package can comprise one die stack (whether a single or multiple stack). Alternatively, a semiconductor package can comprise more than one die stack, and some or all of the stacks can be single stacks, while some or all of the stacks can be multiple stacks.

Dies typically are physically coupled to the substrate via an adhesive layer. Each die also is effectively electrically connected to the substrate. This electrical connection can be created using thin conductive wires, such as gold wires or aluminum wires. Alternatively, dies can be electrically connected to the substrate via small solder balls, using, for example, the flip chip method. These and other methods are well known in the industry. The area where dies are electrically coupled to the substrate can be referred to as the conductive element bonding area or, in the case where wire bonds are present, as the wire bonding area. Dies are first electrically connected to the substrate as desired, and then the die substrate assembly is encapsulated by a protective molding compound, usually comprising a polymer, ceramic, epoxy, or combinations thereof. Encapsulation protects the dies and electrical connections by creating a moisture barrier to prevent physical, chemical and/or electrical damage to the components.

Figure 1:
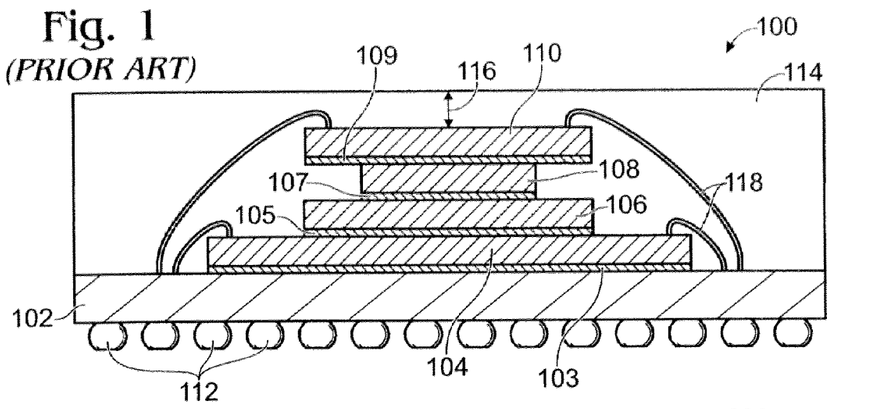
FIG. 1 is a cross-sectional view of a prior art ball grid array semiconductor package.

The substrate, die stack, and encapsulating material combine to form a "package." A cross sectional drawing of a representative prior art package 100 is illustrated in FIG. 1. Illustrated package 100 comprises a substrate 102 and four stacked dies 104, 106, 108, 110 attached to substrate 102 or to another die, via die adhesive layers 103, 105, 107, and 109. Package 100 further comprises solder balls 112 along one surface of substrate 102. Solder balls 112 provide input and output access to dies 104, 106, 108, and 110 once package 100 is connected to a circuit board for use in an electronic product. Semiconductor package 100 has been encapsulated with molding compound 114. Plural conductive bond wires 118 electrically couple each die 104, 106, 108, and 110 to substrate 102.

Numerous different packages 100 are known and used in the art. Some common examples include the polymer ball grid array package, such as the plastic ball grid array (PBGA) package, and the fine ball grid array (FBGA) package. The package also can include a heat spreader, which covers the dies and conductive wires, in order to improve heat transfer, such as during the encapsulation process. Although semiconductor packages, such as package 100, are widely used, however problems still exist with the encapsulation process.

Still with reference to FIG. 1, during the encapsulation process, a mold is placed over dies 104, 106, 108, and 110 and substrate 102, leaving a small gap 116 between the top of molding compound 114 and the top of die 110. Gap 116 is herein referred to as the encapsulant gap 116, and also represents the distance between the top of die 110 and the package surface once encapsulation is complete. Once the mold is in place, a molding compound 114 is injected into the mold, and flows over dies 104, 106, 108, and 110 inside the mold. Molding compound 114 typically is injected at a temperature high enough that molding compound 114 is in a liquid or semi-liquid state, and therefore flows over dies 104, 106, 108, and 110 and substrate 102. Molding compound 114 then cools and hardens to protect substrate 102, dies 104, 106, 108, and 110, and electrical connections, such as bond wires 118.

The encapsulant gap has a significant impact on the molding process. As mentioned above, manufacturers need to keep package size as small as possible, even though dies often are stacked to create IC assemblies to use space most efficiently. As dies are stacked, the encapsulant gap decreases. But as the encapsulant gap decreases, molding compound flow is affected and can become uneven. As a result, various defects in the finished product, such as internal and external voids, wire sweeping, and wire shorts, can occur. Internal and external voids are essentially areas where air has been trapped by molding compound (where air fails to escape), resulting in holes or voids in the package. External voids can subject the device to moisture damage, which can ruin the device. Internal voids may expand if exposed to heat and eventually cause the package layers to separate. In semiconductor packages containing bond wires, another potential problem during the molding process is wire sweeping, where molding compound deforms or breaks the conductive wires, or causes two different bonding wires to contact, creating electrical shorts in the device.

Devices do exist ostensibly designed to reduce air pocket formation. For example, see U.S. Pat. No. 6,969,640 to Dimaano et al., which discloses an "air pocket resistant semiconductor package system." Dimaano discloses using individual heat spreaders placed around each die. Each heat spreader has an encapsulant guide and an air vent, to prevent air pocket formation.

Additionally, U.S. Pat. No. 6,750,533 to Wang et al., discloses a "substrate with dam bar structure for smooth flow of encapsulating resin." Wang's FIG. 1 shows a plan view of a semiconductor package comprising dam bar 56 on substrate 5. "The dam bar 56 formed on the substrate 5, as shown in FIG. 1, is preferably provided with a first gate 560 directed toward the molding gate 55, a second gate 561, and a third gate 562 opposed to the second gate 561, wherein the second and third gates 561, 562 are vertically arranged in position with respect to the molding gate 55; this allows the dam bar 56 to be divided into four sections by means of the first, second and third gates 560,561, 562." Column 4, line 66 through column 5, line 6. "The first gate 560 is sized smaller than the second and third gates 561, 562 respectively." Column 5, lines 7-8. "The geometry, shape and height of the dam bar 56 are critical factors for affecting mold flow of the encapsulating compound." The molding compound is "impeded by the dam bar 56, and diverts to flow through the second and third gates 561, 562." Column 5, lines 20-21.

"As shown in [Wang] FIG. 3A, a simple dam bar 56a is formed with a gate 560a directed toward the molding gate 55, and has found to be ineffective for impeding mold flow of the molding compound." Column 5, lines 51-54. "A dam bar 56b of [Wang] FIG. 3B is similar in structure to the dam bar 56a of [Wang] FIG. 3A, with the difference in that the dam bar 56b is dimensioned with increased length, and a gate 560b of the dam bar 56b is sized smaller than the gate 560a of the dam bar 56a. It has been found that, such a dam bar 56b would reduce a flowing speed of the molding compound." Column 5, lines 55-60. Thus, the properly sized gate is identified as a critical factor by Wang.

Wang FIG. 4 shows a plan view of a semiconductor package comprising dam bar 65 positioned on substrate 6, with flow of the molding compound indicated by the arrow. However, as positioned in Wang FIG. 4, dam bar 65 does not appear capable of controlling the flow of molding compound over each of the chips 63. For example, dam bar 65 is not positioned to effectively control molding compound flow over chip 63.

Moreover, Wang discloses only curvilinear or rectangular dam bars geometry, as illustrated in Wang FIGS. 1, 3A, 3B, and 4. The height of the dam bar disclosed in Wang must be at least 75% of the height of the mold cavity. The dam bar impedes molding compound flow by forcing the molding compound through the gates of the dam bar. Column 6, lines 18-30. As such, the dam bars disclosed in Wang are not well-suited for use in an arrayed semiconductor package with saw lines.

The prior art does not address all potential problems associated with molding compound flow and the encapsulation process. For example, known devices and methods do not effectively control molding compound flow over all areas of the semiconductor package.

SUMMARY

Molding compound typically flows more slowly over dies than it does over substrate areas lacking dies. Where there is no die stack, the encapsulant gap is the entire distance between the substrate and package surface, as opposed to the distance between the top of the die stack and the package surface, where there is a die stack. As a result, the leading edge of molding compound flow deviates from a straight line. Molding compound flow deviation is smallest at the beginning of the flow process, increases as it flows over the surface, and is at the maximum at the end of the encapsulation process. These large deviations can result in the encapsulation defects discussed above.

To facilitate molding compound flow during encapsulation, one embodiment of a disclosed semiconductor package comprises a substrate, a die electrically coupled to the substrate, and a flow controller effectively sized and positioned to control flow of a molding compound. Plural flow controllers also can be provided. Any embodiment can additionally optionally include a passive component or plural passive components. Flow controllers as disclosed and claimed herein are not taught by the prior art discussed above. For example, with the claimed embodiment, molding compound flows over and about the flow controllers during the encapsulation process, as opposed to through gates. In some embodiments, flow controllers facilitate effective molding compound flow to, for example, reduce encapsulation defects such as air voids, wire sweeping, and wire shorts. Flow controllers also can divert molding compound flow from a particular area or direct molding compound flow to a particular area if desired.

Generally, the material used to produce flow controllers is not a solid at the time of positioning, but instead typically has a viscosity from about 2,000 to about 6,000 (centipoise cP) at 25° C. Before the molding process takes place, flow controllers may solidify, in order to maintain their position during encapsulation. Materials with a higher viscosity can be used to help prevent, or can comprise adhesive on a portion thereof, flow controllers from contacting elements within the semiconductor package. Flow controllers can be composed of a single material or can comprise any number of materials, including die adhesive (e.g. epoxy with silicon or Teflon filler), die coating material (e.g. polyimide), polymeric materials, screen printing materials, solder paste (e.g. Sn, SnAgCu), or combinations thereof. Flow controllers can comprise a non-insulating material. Flow controllers can comprise adhesive material, to allow for direct attachment to a desired surface or component, such as the substrate. Alternatively, flow controllers may comprise a composite, where a layer of adhesive material is applied to a surface within the package and a polymer or "dummy" block is coupled to the layer of adhesive, in order to control molding compound flow. Dummy blocks provide certain advantages in the claimed products and processes, such as reducing the need to use larger amounts of adhesive material to control flow over a large area of the substrate.

Molding compound flow controllers can be used in any semiconductor package. Embodiments can be implemented with a semiconductor package comprising a single die, plural dies, and/or an array of dies. A semiconductor package comprising an array of dies can have single stacks and/or multiple stacks. Flow controllers can be applied to a package at any point during the process of making the semiconductor package, such as before, during, or after die attachment, or, in packages which contain wire bonds, before, during, or after wire bonding. Flow controllers can be positioned and applied using any suitable technique, including without limitation, epoxy dispensing and attach systems, epoxy dotting and attach systems, die coating, or screen printing.

Flow controllers can be positioned as desired within the semiconductor package to facilitate encapsulation over all active components coupled to the substrate. Flow controllers can be coupled to the substrate, dies, and/or any other structures within the package. Alternatively, flow controllers can be positioned such that they are coupled to any interposers that may be present within the semiconductor package.

The numbers, sizes, shapes, and locations of flow controllers can be selectively determined and optimized based on die and/or bond wire layout in a particular package. Flow controllers can take any shape, such as substantially rectangular, cubic, spherical, cylindrical, conical, or pyramidal. Flow controllers also can be amorphous, or can comport to the shape of components and structures. When a semiconductor package comprises plural flow controllers, each flow controller may be the same, or may be a different shape, size, and/or composition.

Flow controller dimensions and position can be determined by any appropriate method, such as by trial and error, with computer software, or via a remote computer. Any embodiment can be implemented by a computer, such as by executing instructions for flow controller positioning contained by computer readable media. Flow controllers can be positioned in a symmetrical or asymmetrical fashion relative to other package components. They can be positioned on one side or on multiple different sides of the dies. When plural flow controllers are positioned, they can be positioned independently of one another.

In some embodiments, flow controllers can be positioned so that they do not contact the dies. Alternatively, flow controllers can contact the dies, any bond wires present and/or the substrate space in between the die stacks. A flow controller can be positioned such that at least a portion of the flow controller is within a perimeter defined by the dies, between adjacent dies, and/or within a perimeter defined by conductive elements. When the semiconductor package comprises an array of dies, flow controllers can be positioned outside a perimeter defined by the array or, alternatively, within a perimeter defined by the array. Further, in embodiments including saw lines between individual die stacks, flow controllers can be positioned such that they extend over the saw lines, covering the entire distance between die stacks. Alternatively, flow controllers can be positioned so that they are not continuous between the die stacks, in that there is an interruption in flow controller material at the locations of saw lines. In this manner, flow controllers will not be visible on the side edges of the semiconductor packages after singulation.

In semiconductor packages further comprising bonding wires, flow controllers can be small enough to be positioned between adjacent bonding wires, and/or substantially within a perimeter defined by the bond wires. In this embodiment, the flow controller may be positioned such that it does not contact the bonding wires or a die. Alternatively, a flow controller can be positioned such that it does contact bond wires, or a flow controller may substantially embed a bond wire or wires. In one embodiment, a single flow controller may constitute a single integrated body which contacts the surfaces of the substrate, bond wires, and dies. As another option, flow controllers can be positioned outside the perimeter defined by the bonding wires. In other embodiments, flow controllers can be located such that a portion of a flow controller is located within the perimeter defined by the bond wires, and a portion of the same flow controller is located outside the perimeter defined by the bond wires. Flow controllers can be coupled to the substrate in any and all of these embodiments.

When a single package contains more than one flow controller, multiple flow controllers can be arranged as desired. For example, in one embodiment, some flow controllers can be located outside a perimeter defined by the bond wires, while others can be located within a perimeter defined by the bond wires. In another embodiment, a flow controller can be located such that a first portion is within the perimeter defined by the bond wires, while a second portion is outside the perimeter defined by the bond wires, and while a second flow controller can be positioned entirely outside the perimeter defined by the bond wires. In yet another embodiment, a flow controller can be located such that a first portion is within the perimeter defined by the bond wires, while a second portion is outside the perimeter defined by the bond wires, and while a second flow controller can be positioned entirely within the perimeter defined by the bond wires. Additionally, in some embodiments, all three of these general positions could be present within a single semiconductor package.

Flow controller height can be selected to optimize control of molding compound flow, and can be much smaller than that of the dies, substantially the same as that of the dies larger than the dies, or any size in between. Furthermore, if plural flow controllers are used, each can have different size and/or shape, all can have the same size and/or shape, or any and all combinations of shape and size. At a minimum, flow controller height can be any dimension greater than zero which still allows for functionality as a flow controller. The upper limit of flow controller height is determined by molding compound thickness. If flow controllers extend above the top of the molding compound, damage to the molding tool is possible. A relatively thin flow controller may require greater surface area to have the same impact on molding compound flow, as flow controller volume may be a factor for controlling molding compound flow. In commercial embodiments, the minimum flow controller volume typically is about $1 \times 10^{-3}$ cc; however, flow controller volume can be any volume greater than zero which still allows for functionality as a flow controller. In some embodiments, flow controller volume is greater than $1 \times 10^{-2}$ cc. The upper limit for flow controller volume is the difference between the volume of molding compound in a certain package and the volume of stacked dies and die adhesive layers contained within the package.

A disclosed method for manufacturing a semiconductor package comprises providing a substrate and a flow controller operatively associated with the substrate and effectively sized and positioned to control flow of a molding compound. Alternatively, plural flow controllers may be provided. During the encapsulation process molding compound flows over the surface of the flow controllers, dies, and substrate, as in the typical encapsulation process. In one embodiment, using flow controllers does not require altering the encapsulation process beyond application of the flow controllers themselves.

Disclosed method for using flow controllers comprises providing a flow controller operable to influence or control flow of a molding compound. For example, flow controllers can reduce the speed of molding compound, direct its flow, and/or divert flow of a molding compound from certain areas of the semiconductor package. In some embodiments, flow controllers substantially create a uniform leading edge of molding compound flow and, as a result, reduce the occurrence of defects during encapsulation. Thus, flow controllers substantially can prevent internal and external voids, wire sweeping, and wire shorts, and can facilitate filling a narrow encapsulant gap.

Semiconductor packages, generally such as fine ball grid array packages and polymer ball grid arrays, such as plastic ball grid arrays, may be manufactured according to the disclosed methods. Once encapsulation is complete, semiconductor packages with flow controller elements can be incorporated into any electronic product requiring IC assemblies. These include such devices as computers, personal digital assistants, digital cameras, and cellular telephones. Instructions for providing the disclosed flow controllers can be included on a computer readable medium.

The foregoing and other objects, features, and advantages of the invention will become more apparent from the following detailed description, which proceeds with reference to the accompanying figures.

TERMS

As used in this application and in the claims, the singular forms "a," "an," and "the" include the plural forms unless the context clearly dictates otherwise. Additionally, the term "includes" means "comprises." Further, the term "coupled" means physically, electrically and/or electromagnetically coupled or linked and does not exclude the presence of intermediate elements between the coupled items.

Although the operations of embodiments of the disclosed method are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed system, method, and apparatus can be used in conjunction with other systems, methods, and apparatus. Additionally, the description sometimes uses terms like "produce" and "provide" to describe the disclosed method. These terms may be high-level abstractions of the actual operations that can be performed. The actual operations that correspond to these terms can vary depending on the particular implementation and are discernible by a person of ordinary skill in the art.

DETAILED DESCRIPTION

Figure 2:
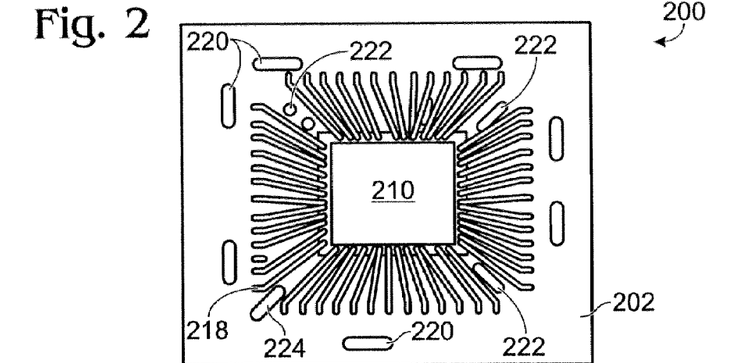
FIG. 2 is a plan view illustrating one embodiment of a ball grid array semiconductor package with bonded wires and a plurality of flow controllers.

FIG. 2 shows a plan view of a semiconductor package 200, comprising a substrate 202 and a die 210 electrically coupled to substrate 202 by a plurality of conductive bond wires 218. FIG. 2 also illustrates various positions for flow controllers 220, 222, and 224 relative to other package components. Each of these can be used alone, or any and all combinations of such positioning can be used. For example, one or more flow controllers 220 optionally can be positioned adjacent to, but substantially outside a perimeter defined by, bond wires 218. Plural flow controllers 220, 222, and 224 are illustrated in FIG. 2, however there may be more or fewer flow controllers in any given embodiment.

In another embodiment, one or more flow controllers 222 optionally can be positioned substantially within the perimeter defined by bond wires 218. Flow controller 222 can be coupled to substrate 202 and can be positioned between adjacent bond wires 218, such that flow controller 222 does not contact bond wires 218. Plural flow controllers 222 are illustrated in FIG. 2, however there may be more or fewer flow controllers 222 in any given embodiment.

In still another embodiment, one or more flow controllers 222 can be positioned within the perimeter defined by bond wires 218, and one or more flow controllers 220 may be positioned around the perimeter defined by bond wires 218. In yet another embodiment, one or more flow controllers 224 may have a first portion located within the perimeter defined by bond wires 218, and a second portion located outside the perimeter defined by bond wires 218. As shown in FIG. 2, flow controllers 220, 222, and 224 do not have to be positioned relative to one another to form gates. Instead, during encapsulation, molding compound (not shown) flows over and about flow controllers 220, 222, and/or 224.

FIG. 2 illustrates various positions for flow controllers 220, 222, and 224 for one embodiment. A person of ordinary skill in the art will recognize that in any given embodiment, some or all of these positions may be used, alone or in combination. For example, flow controllers 220, 222, and/or 224 can be positioned to protect a specific wire 218 or a group of such wires 218 from damage. Flow controllers 220, 222, and/or 224 also can divert molding compound flow from a specific area on substrate 202.

Substrate 202 can comprise any material commonly used in the semiconductor industry. These include, but are not limited to, flexible resin tape, fiberglass/copper sheet laminate, ceramic, flexible metal lead frame, and ball grid arrays. Substrate 202 is not limited to semiconductor materials; it can be formed of semiconducting materials, insulating materials, conducting materials, or combinations thereof. Substrate 202 optionally can include thermal vias, or holes, extending from a first surface to a second surface, to allow heat to escape.

Die 210 usually comprises semiconductor materials, such as silicon, germanium, or gallium arsenide. Each die can comprise multiple semiconductor devices, often in layers, such as can be formed via photolithographic techniques. Dies 210 are typically active components, in that they usually require a power supply to operate. Passive components are those which do not need a power supply to function, and include components such as resistors, capacitors, and inductors. In addition to one or more dies 210, substrate 202 optionally may include one or more passive components.

Figure 3:
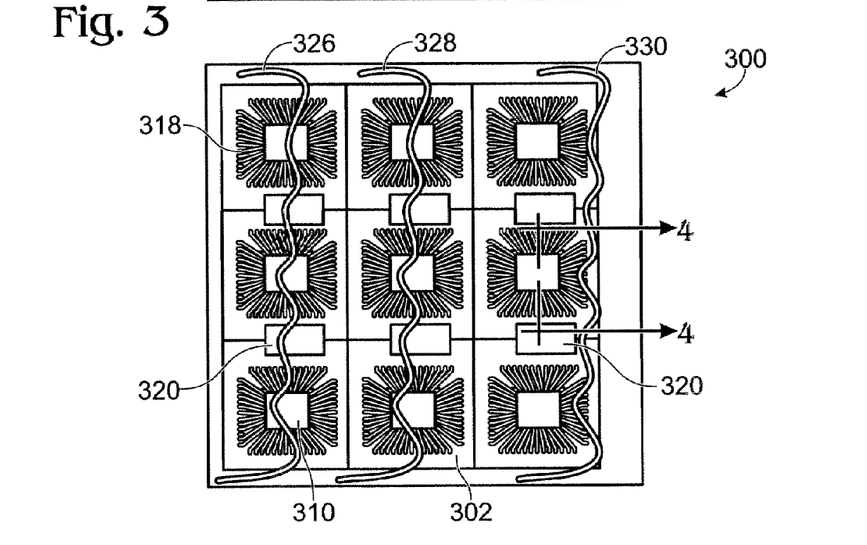
FIG. 3 is a schematic plan view illustrating the leading edge of molding compound flowing over a device comprising a plurality of flow controllers.

FIG. 3 shows a plan view of semiconductor device 300 comprising substrate 302 and a plurality of dies 310, each of which can be identical or distinct, and each with a plurality of bond wires 318 electrically coupling dies 310 to substrate 302. FIG. 3 also illustrates a plurality of flow controllers 320 interspersed between dies 310. Leading edges 326, 328, and 330 of molding compound flow represent three different points in time as molding compound flows from left to right along device 300. Leading edge 326 depicts the flow profile at a first time substantially at the beginning of the encapsulation process, while leading edge 328 is at a second time near the middle of the process, and leading edge 330 depicts the flow profile at a third time nearing completion of encapsulation. Flow controllers 320 can facilitate molding compound flow, such as to keep leading edge 326 substantially similar to leading edges 328 and 330. The more smoothly molding compound flows, the less likely defects are to develop. Thus, flow controllers 320 substantially can prevent defects from forming in the encapsulated device. In this as well as all other embodiments, variable features of flow controllers 320, such as volume, surface area, shape, and location, can be optimized based on the structure of semiconductor package 300 or dies 310 or based on the desired effect on molding compound flow.

Figure 4:
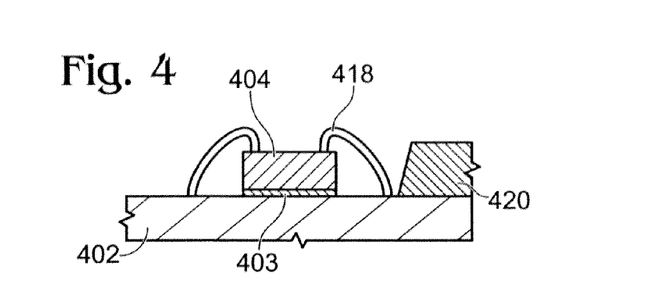
FIG. 4 is a cross sectional view of a single stack ball grid array semiconductor package comprising a flow controller.

FIG. 4 shows a cross sectional view taken along line 4-4 in FIG. 3. A single die 404 is physically attached to substrate 402 by die adhesive layer 403, and electrically coupled to substrate 402 via bond wires 418. Flow controller 420 is shown coupled to substrate 402, and adjacent to die 404 and bond wires 418. In the illustrated embodiment of FIG. 4, the heights of flow controller 420 and die 404 are substantially similar. However, in other embodiments, flow controller 420 heights can be selected for a particular purpose. As a result, in other embodiments, there is no particular height required for flow controller 420, nor does its height have to be substantially similar to the height of die 404. The embodiment shown in FIG. 4 optionally can include additional dies 404 and adhesive layers 403, which may comprise devices identical to or different from die 404.

Figure 5:
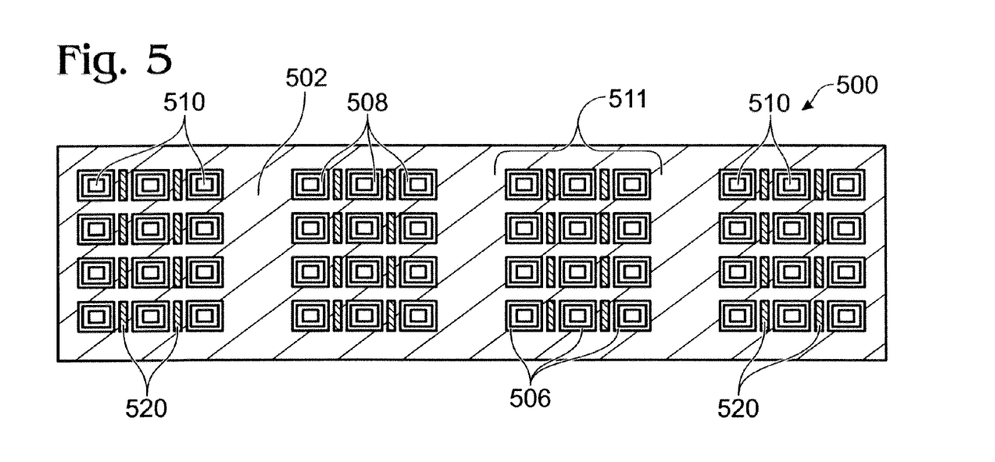
FIG. 5 is a plan view of blocked fine ball grid array semiconductor packages before encapsulation.

FIG. 5 shows a plan view of semiconductor package 500 before encapsulation, comprising substrate 502, and a plurality of dies 506, 508, and 510 arrayed on substrate 502. Dies 506, 508, and 510 are stacked and arranged into four blocks 511. As shown in FIG. 5, each die stack comprises die 506 adhered to substrate 502, die 508 adhered to die 506, and die 510 adhered to die 508. As one skilled in the art will recognize, dies 506, 508, and 510 may be identical or distinct devices. Dies 506, 508, and 510 are not limited in any way by their depiction in FIG. 5; there may be additional dies stacked amongst dies 506, 508, and 510. Further, as shown in FIG. 5, die 510 has a smaller footprint than die 508, which in turn has a smaller footprint than die 506. FIG. 5 illustrates only one embodiment of possible arrangements of dies. In other embodiments, die 510 may have a larger or smaller footprint than die 508, which may have a larger or smaller footprint than die 506 or any other dies present in the stack.

Package 500 further comprises a plurality of flow controllers 520 interspersed between stacked dies 506, 508, and 510. In this embodiment, flow controllers 520 are located inside a perimeter defined by each block 511, adjacent to dies 506, 508, and 510. In alternative embodiments, flow controllers 520 optionally can be positioned at various other locations, such as in areas of substrate 502 between blocks 511, or adjacent to some dies 506, 508, and 510, but not others.

Figure 6:
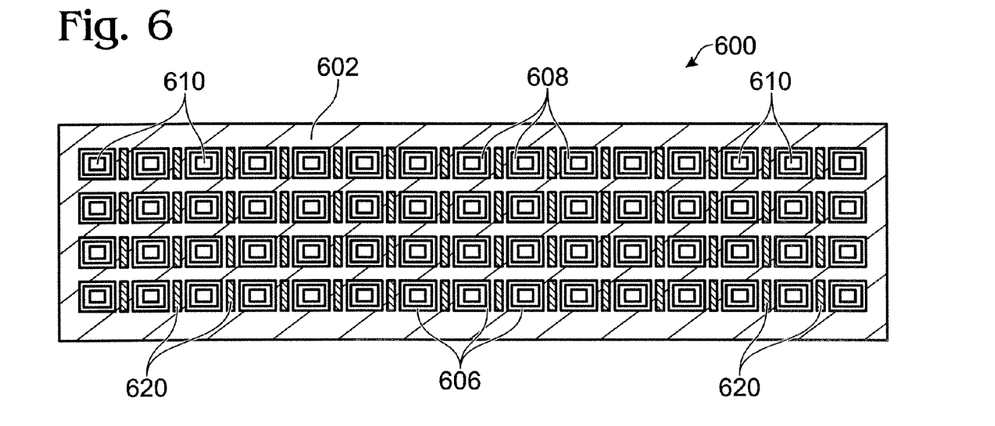
FIG. 6 is a plan view of a single blocked fine ball grid array semiconductor package comprising a plurality of flow controllers.

FIG. 6 shows a plan view of semiconductor package 600 comprising substrate 602, and a plurality of dies 606, 608, and 610 stacked and arrayed on substrate 602. As shown in FIG. 6, each die stack comprises die 606 adhered to substrate 602, die 608 adhered to die 606, and die 610 adhered to die 608. As a person of ordinary skill in the art will recognize, dies 606, 608, and 610 may be identical or distinct devices. Dies 606, 608, and 610 are not limited in any way by their depiction in FIG. 6; there may be additional dies stacked amongst dies 606, 608, and 610. Further, as shown in FIG. 6, die 610 has a smaller footprint than die 608, which in turn has a smaller footprint than die 606. FIG. 6 illustrates only one embodiment of possible arrangements of dies. In other embodiments, die 610 may have a larger or smaller footprint than die 608, which may have a larger or smaller footprint than die 606 or any other dies present in the stack.

Package 600 further comprises a plurality of flow controllers 620 interspersed between die stacks. FIG. 6 illustrates a certain placement of flow controllers 620. A person of ordinary skill in the art will recognize that the scope of possible embodiments is not limited to the illustrated positioning. For example, flow controllers 620 can be positioned outside a perimeter defined by arrayed dies 606, 608 and 610. Alternatively, flow controllers 620 can be positioned between some dies 606, 608, and 610, but not others. Positioning of flow controllers 620 can be altered to affect molding compound flow as desired.

Figure 7:
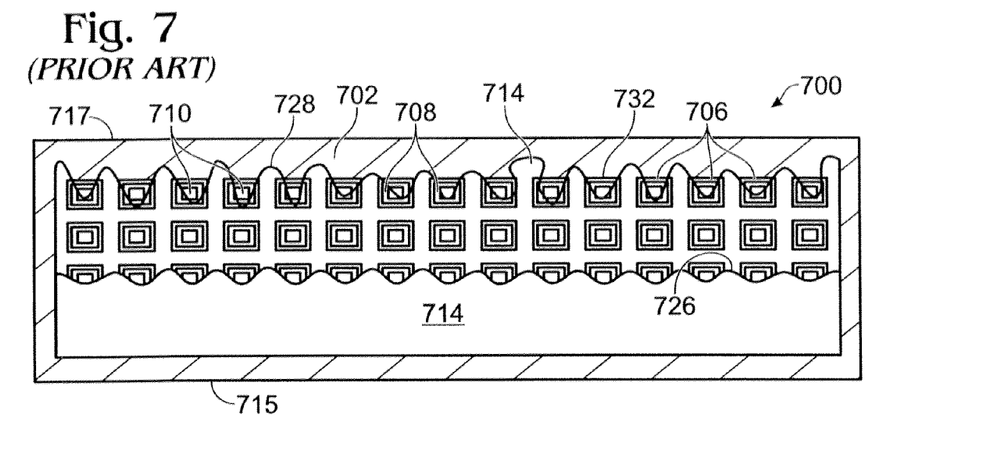
FIG. 7 is a plan view of a prior art ball grid array semiconductor package illustrating molding compound flow in the absence of flow controllers.

FIG. 7 shows a plan view of a prior art semiconductor package 700 comprising substrate 702, and a plurality of dies 706, 708, and 710 stacked and arrayed on substrate 702. As shown in FIG. 7, each die stack comprises die 706 adhered to substrate 702, die 708 adhered to die 706, and die 710 adhered to die 708. A person of ordinary skill in the art will recognize that dies 706, 708, and 710 may be identical or distinct devices. Dies 706, 708, and 710 are not limited in any way by their depiction in FIG. 7; there may be additional dies stacked amongst dies 706, 708, and 710. Further, as shown in FIG. 7, die 710 has a smaller footprint than die 708, which in turn has a smaller footprint than die 706. FIG. 7 illustrates only one embodiment of possible arrangements of dies. In other embodiments, die 710 may have a larger or smaller footprint than die 708, which may have a larger or smaller footprint than die 706 or any other dies present in the stack.

Package 700 further comprises molding compound 714, shown during an encapsulation process. In this illustrated embodiment, molding compound 714 flows in a direction from first edge 715 to second edge 717. For clarity, molding compound 714 is only shown over a portion of package 700. A first leading edge 726 of molding compound 714 is shown at a point almost half way through the encapsulation process. A second leading edge 728 is shown at a point nearing the end of the encapsulation process. Flow of molding compound 714 is uneven and results in defect formation, such as in area 732. Some dies 706, 708, and/or 710 near second edge 717 may not be encapsulated, or may not be fully encapsulated, due to areas 732.

Figure 8:
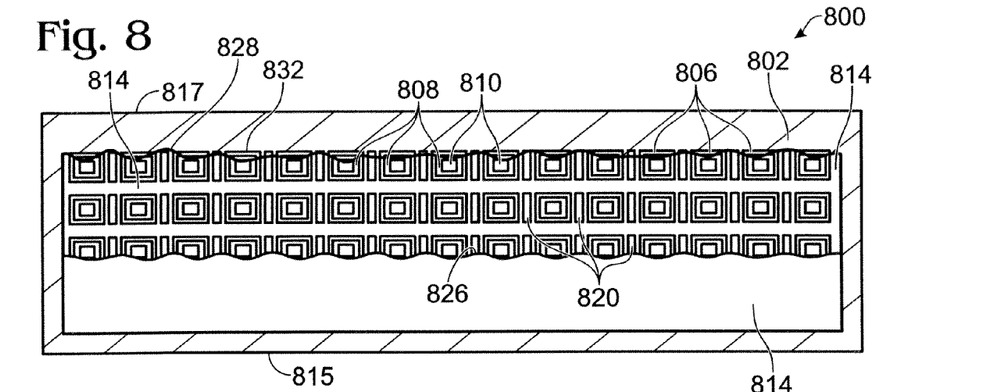
FIG. 8 is a plan view of the single blocked ball grid array semiconductor package of FIG. 6 illustrating molding compound flow using flow controllers according to one disclosed embodiment.

For comparison, FIG. 8 is a plan view of semiconductor package 800 according to one embodiment of the present invention, comprising substrate 802 and a plurality of dies 806, 808, and 810 stacked and arrayed on substrate 802, where dies 806, 808, and 810 are partially obscured by molding compound 814. As shown in FIG. 8, each die stack comprises die 806 adhered to substrate 802, die 808 adhered to die 806, and die 810 adhered to die 808. A person of ordinary skill in the art will recognize that dies 806, 808, and 810 may be identical or distinct devices. Dies 806, 808, and 810 are not limited in any way by their depiction in FIG. 8; there may be additional dies stacked amongst dies 806, 808, and 810. Further, as shown in FIG. 8, die 810 has a smaller footprint than die 808, which in turn has a smaller footprint than die 806. FIG. 8 illustrates only one embodiment of possible arrangements of dies. In other embodiments, die 810 may have a larger or smaller footprint than die 808, which may have a larger or smaller footprint than die 806 or any other dies present in the stack.

Package 800 further comprises a plurality of flow controllers 820 interspersed between stacked dies 806, 808, and 810. As in FIG. 7, encapsulation is in progress, as indicated by molding compound 814 flowing in a direction from first edge 815 to second edge 817. For clarity, molding compound 814 is only shown over a portion of package 800. A first leading edge 826 of molding compound 814 is shown at a point almost half way through the encapsulation process. A second leading edge 828 is shown at a point nearing the end of encapsulation. However, in this embodiment, flow controllers 820 have resulted in more uniform first and second leading edges 826 and 828 of molding compound 814, when compared with leading edges 726 and 728 in FIG. 7. As a result, some embodiments of the present invention can substantially reduce flow defects. For example, dies 806, 808, and 810 will not be left exposed, and/or there will be a reduction in exposure after the encapsulation process is complete. Moreover, at this stage in encapsulation, exposed areas 832 are much smaller than exposed areas 732 in FIG. 7, and thus, formation of air pockets is less likely. Flow controllers 820 thus can substantially reduce, and potentially eliminate, the presence of defects such as voids, wire sweeping, and wire shorts, which can form during encapsulation.

Figure 9:
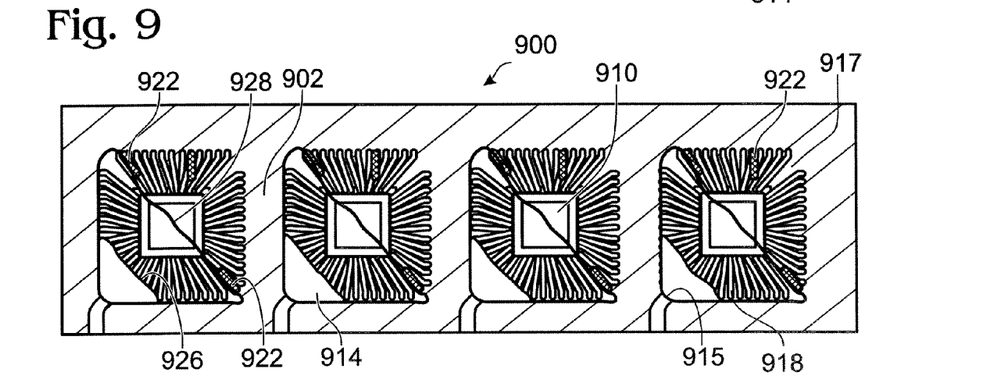
FIG. 9 is a plan view of a plastic ball grid array semiconductor package comprising 4 units and a plurality of flow controllers illustrating flow of molding compound at various times during the encapsulation process.

FIG. 9 shows a plan view of semiconductor package 900 during encapsulation. Package 900 comprises substrate 902, a row of four dies 910, a plurality of bonding wires 918 electrically coupling dies 910 to substrate 902, and one or more flow controllers 922. Package 900 further comprises a molding compound 914 flowing in a diagonal direction across package 900 from a first corner 915 to a second corner 917. For clarity, molding compound 914 is only shown over a portion of package 900. A first leading edge 926 of molding compound 914 is shown at a point about a quarter of the way through encapsulation. A second leading edge 928 is shown at a point about half way through encapsulation. Flow controllers 922 provide for substantially smooth leading edges 926 and 928. In this embodiment, flow controllers 922 are located substantially within a perimeter defined by bond wires 918. In other embodiments, flow controllers 922 can be positioned elsewhere, such as outside a perimeter defined by bond wires 918, or partly within and partly outside the perimeter defined by bond wires 918.

Figure 10:
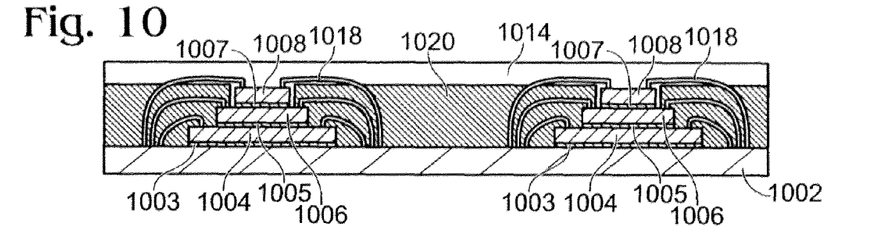
FIG. 10 is a cross sectional view of a ball grid array semiconductor package comprising a flow controller contacting bond wires and dies.

FIG. 10 shows a cross sectional view of one possible embodiment, comprising substrate 1002 supporting dies 1004, 1006 and 1008, which are adhered via die adhesive layers 1003, 1005, and 1007. Adhesive layer 1003 couples die 1004 to substrate 1002, adhesive layer 1005 couples die 1006 to die 1004, and adhesive layer 1007 couples die 1008 to die 1006. Dies 1004, 1006, and 1008 may be identical or distinct devices. Dies 1004, 1006, and 1008 are not limited in any way by their depiction in FIG. 10; there may be additional dies stacked amongst dies 1004, 1006, and 1008. Further, as shown in FIG. 10, die 1008 has a smaller footprint than die 1006, which in turn has a smaller footprint than die 1004. FIG. 10 illustrates only one embodiment of possible die arrangement. In other embodiments, die 1008 may have a larger or smaller footprint than die 1006, which may have a larger or smaller footprint than die 1004 or any other dies present in the stack.

Dies 1004, 1006, and 1008 are electrically coupled to substrate 1002 by a plurality of bonding wires 1018. This embodiment further comprises a layer of flow controller material 1020 and encapsulant 1014. Flow controller 1020 can be applied such that it contacts substrate 1002, dies 1004, 1006, and 1008, and bonding wires 1018, as shown in FIG. 10. In this embodiment, flow controller 1020 substantially can contact all exposed surfaces within the semiconductor package, including the surfaces of substrate 1002, dies 1004, 1006, and 1008, bond wires 1018, and any passive devices present. Flow controller 1020 can contact substantially the entire length of at least one bond wire 1018 such that bond wire 1018 is substantially embedded within flow controller 1020. Further, FIG. 10 optionally can include a saw line 1240, as in FIG. 12. The embodiment illustrated in FIG. 10 comprises bond wires 1018; however, in alternative embodiments, dies 1004, 1006, and 1008 can be electrically coupled to substrate 1002 without bond wires 1018. In this alternative embodiment, flow controllers 1020 can remain in contact with dies 1004, 1006, and 1008 as well as substrate 1002.

Figure 11:
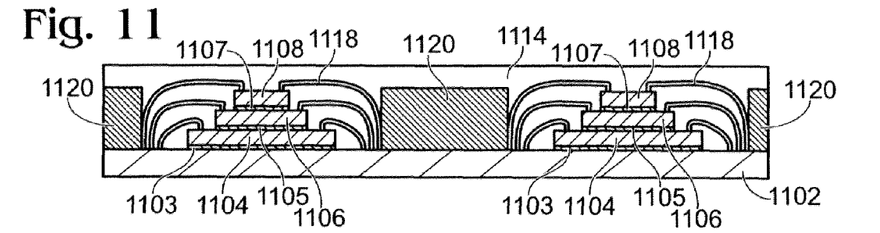
FIG. 11 is a cross sectional view of a ball grid array semiconductor package comprising a flow controller located adjacent to bond wires and dies.

FIG. 11 shows a cross sectional view of an another alternative embodiment, comprising substrate 1102 and dies 1104, 1106, and 1108 adhered to substrate 1102 via adhesive layers 1103, 1105, and 1107, and electrically coupled to substrate 1102 by a plurality of bond wires 1118. Adhesive layer 1103 couples die 1104 to substrate 1102, adhesive layer 1105 couples die 1106 to die 1104, and adhesive layer 1107 couples die 1108 to die 1106. Dies 1104, 1106, and 1108 may be identical or distinct devices. Dies 1104, 1106, and 1108 are not limited in any way by their depiction in FIG. 11; there may be additional dies stacked amongst dies 1104, 1106, and 1108. Further, as shown in FIG. 11, die 1108 has a smaller footprint than die 1106, which in turn has a smaller footprint than die 1104. FIG. 11 illustrates only one embodiment of possible die arrangement. In other embodiments, die 1108 may have a larger or smaller footprint than die 1106, which may have a larger or smaller footprint than die 1104 or any other dies present in the stack.

The embodiment illustrated in FIG. 11 further comprises an encapsulant 1114 and one or more flow controllers 1120 positioned adjacent to bond wires 1118. In this embodiment, and in contrast to FIG. 10, flow controllers 1120 contact neither dies 1104, 1106, and 1108 nor bond wires 1118. Flow controllers 1120 are coupled to substrate 1102, but do not pass under or around bond wires 1118. In the illustrated embodiment of FIG. 11, the heights of flow controller 1120 and stacked dies 1104, 1106 and 1108 are substantially similar. However, in other embodiments, flow controller 1120 heights can be selected for a particular purpose. As a result, in other embodiments, there is no particular height required for flow controller 1120, nor does its height need be substantially similar to the height of stacked dies 1104, 1106, and 1108. Further, the embodiment illustrated in FIG. 11 optionally can include a saw line 1340, as in FIG. 13.

Figure 12:
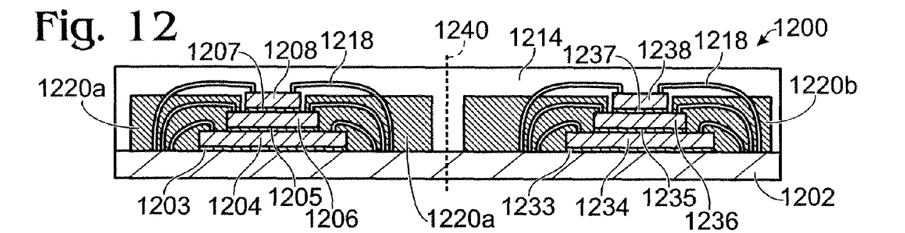
FIG. 12 is a cross sectional view of the ball grid array semiconductor package of FIG. 10 comprising flow controllers adjacent to saw lines.

FIG. 12 shows a cross sectional view of semiconductor package 1200, comprising substrate 1202 supporting a first stack of dies 1204, 1206 and 1208 adhered via adhesive layers 1203, 1205, and 1207, and a second stack of dies 1234, 1236, and 1238 adhered via die adhesive layers 1233, 1235, and 1237. Adhesive layer 1203 couples die 1204 to substrate 1202, adhesive layer 1205 couples die 1206 to die 1204, adhesive layer 1207 couples die 1208 to die 1206, adhesive layer 1233 couples die 1234 to substrate 1202, adhesive layer 1235 couples die 1236 to die 1234, and adhesive layer 1237 couples die 1238 to die 1236. Dies 1204, 1206, 1208, 1234, 1236, and 1238 may be identical or distinct devices. Dies 1204, 1206, 1208, 1234, 1236, and 1238 are not limited in any way by their depiction in FIG. 12; there may be additional dies stacked amongst shown dies 1204, 1206, 1208, 1234, 1236, and 1238. Further, as shown in FIG. 12, die 1208 has a smaller footprint than die 1206, which in turn has a smaller footprint than die 1204, while 1238 has a smaller footprint than die 1236, which in turn has a smaller footprint than die 1234. FIG. 12 illustrates only one embodiment of possible die arrangement. In other embodiments, die 1208 may have a larger or smaller footprint than die 1206, which may have a larger or smaller footprint than die 1204 or any other dies present in the stack. Similarly, die 1238 may have a larger or smaller footprint than die 1236, which may have a larger or smaller footprint than die 1234 or any other die present in the stack.

Dies 1204, 1206, 1208, 1234, 1236, and 1238 are electrically coupled to substrate 1202 by a plurality of bond wires 1218. This embodiment further comprises encapsulant 1214, first flow controller 1220a and second flow controller 1220b. Package 1200 is designed for singulation along saw line 1240 to produce a plurality of individual packages. Saw line 1240 separates first flow controller 1220a from second flow controller 1220b. First flow controller 1220a can be identical to second flow controller 1220b. Alternatively, first flow controller 1220a can differ from second flow controller 1220b in size, shape, and/or composition. Additionally, FIG. 12 may represent the cross section of only a portion of an entire semiconductor package. Alternative embodiments may comprise multiple other die stacks, similar to dies 1204, 1206, 1208, 1234, 1236, and 1238, as well as a plurality of other flow controllers, similar to flow controllers 1220a and 1220b.

Flow controllers 1220a and/or 1220b can be positioned such that they contact substrate 1202, dies 1204, 1206, 1208, 1234, 1236, and 1238 and bonding wires 1218, as shown in FIG. 12. In this embodiment, flow controllers 1220a and 1220b substantially can contact all exposed surfaces within the semiconductor package, including the surfaces of substrate 1202, dies 1204, 1206, 1208, 1234, 1236, and 1238, bond wires 1218, and any passive devices present. Flow controllers 1220a and/or 1220b can contact substantially the entire length of at least one bond wire 1218 such that bond wire 1218 is substantially embedded within flow controllers 1220a and 1220b. In this embodiment, flow controllers 1220a and 1220b do not extend to cover the entire distance between first stacked dies 1204, 1206, and 1208 and second stacked dies 1234, 1236, and 1238 because there is an interruption between flow controllers 1220a and 1220b along saw line 1240. Flow controllers 1220a and 1220b are adjacent to saw line 1240, but do not extend across it. In this embodiment, flow controllers 1220a and 1220b will not be visible after singulation, because encapsulant 1214 fills the space between flow controller 1220a and flow controller 1220b.

The embodiment of FIG. 12 comprises bond wires 1218; however, in alternative embodiments, dies 1204, 1206, 1208, 1234, 1236, and 1238 can be electrically coupled to substrate 1202 without bond wires 1218. In this alternative embodiment, flow controllers 1220a and 1220b can remain in contact with dies 1204, 1206, 1208, 1234, 1236, and 1238 as well as substrate 1202.

Figure 13:
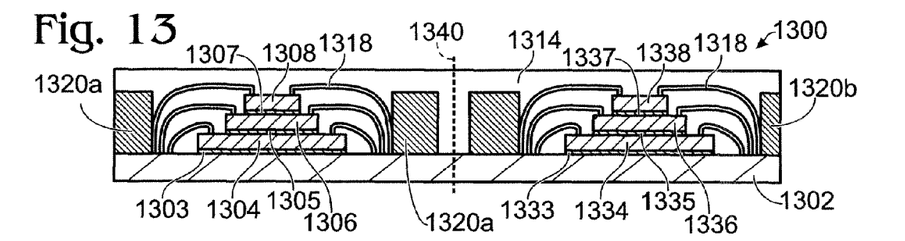
FIG. 13 is a cross sectional view of the ball grid array semiconductor package of FIG. 11 comprising flow controllers adjacent to the lines.

FIG. 13 shows a cross sectional view of semiconductor package 1300 comprising substrate 1302 supporting a first stack of dies 1304, 1306 and 1308 adhered via adhesive layers 1303, 1305, and 1307, and a second stack of dies 1334, 1336, and 1338 adhered via adhesive layers 1333, 1335, and 1337. Adhesive layer 1303 couples die 1304 to substrate 1302, adhesive layer 1305 couples die 1306 to die 1304, adhesive layer 1307 couples die 1308 to die 1306, adhesive layer 1333 couples die 1334 to substrate 1302, adhesive layer 1335 couples die 1336 to die 1334, and adhesive layer 1337 couples die 1338 to die 1336. Dies 1304, 1306, 1308, 1334, 1336, and 1338 may be identical or distinct devices. Dies 1304, 1306, 1308, 1334, 1336, and 1338 are not limited in any way by their depiction in FIG. 13; there may be additional dies stacked amongst shown dies 1304, 1306, 1308, 1334, 1336, and 1338. Further, as shown in FIG. 13, die 1308 has a smaller footprint than die 1306, which in turn has a smaller footprint than die 1304, while 1338 has a smaller footprint than die 1336, which in turn has a smaller footprint than die 1334. FIG. 13 illustrates only one embodiment of possible die arrangement. In other embodiments, die 1308 may have a larger or smaller footprint than die 1306, which may have a larger or smaller footprint than die 1304 or any other dies present in the stack. Similarly, die 1338 may have a larger or smaller footprint than die 1336, which may have a larger or smaller footprint than die 1334 or any other dies present in the stack.

Dies 1304, 1306, 1308, 1334, 1336, and 1338 are electrically coupled to substrate 1302 by a plurality of bond wires 1318. This embodiment further comprises an encapsulant 1314, first flow controller 1320a and second flow controller 1320b. Package 1300 subsequently will be singulated along saw line 1340 to produce a plurality of individual packages. Saw line 1340 separates first flow controller 1320a from second flow controller 1320b. First flow controller 1320a can be identical to second flow controller 1320b. Alternatively, first flow controller 1320a can differ from second flow controller 1320b in size, shape, and/or composition. Additionally, FIG. 13 may represent the cross section of only a portion of an entire semiconductor package. Alternative embodiments may comprise multiple other die stacks, similar to dies 1304, 1306, 1308, 1334, 1336, and 1338, as well as a plurality of other flow controllers, similar to flow controllers 1320a and 1320b.

Flow controllers 1320a and/or 1320b can be positioned such that they contact neither dies 1304, 1306, 1308, 1334, 1336, and 1338 nor bond wires 1318 as shown in FIG. 13. Flow controllers 1320a and 1320b are coupled to substrate 1302, but do not pass under or around bond wires 1318. In this embodiment, flow controllers 1320a and 1320b do not extend to cover the entire distance between first stack of dies 1304, 1306, and 1308 and second stack of dies 1334, 1336, and 1338 because there is an interruption between flow controllers 1320a and 1320b along saw line 1340. Flow controllers 1320a and 1320b are adjacent to saw line 1340, but do not extend across it. In this embodiment, flow controllers 1320a and 1320b will not be visible after singulation, because encapsulant 1314 fills the space between flow controller 1320a and flow controller 1320b.

The embodiment illustrated in FIG. 13 comprises bond wires 1318; however, in alternative embodiments, dies 1304, 1306, 1308, 1334, 1336, and 1338 can be electrically coupled to substrate 1302 without bond wires 1318. In this embodiment, flow controllers 1320a and 1320b can remain coupled to substrate 1302 without contacting dies 1304, 1306, 1308, 1334, 1336, or 1338.

Figure 14:
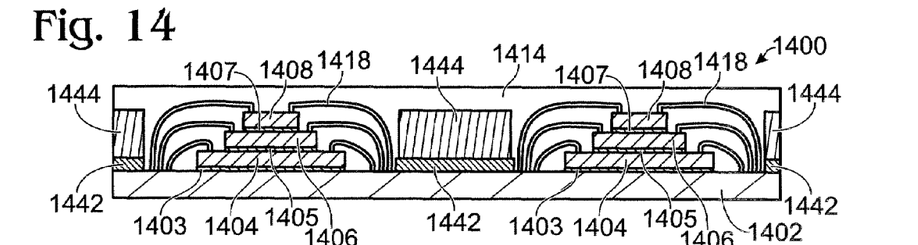
FIG. 14 is a cross sectional view of a ball grid array semiconductor package comprising flow controllers adjacent to bond wires and dies, where the illustrated embodiment of the flow controllers comprises a dummy block and an adhesive layer.

In a further embodiment, illustrated in cross section by FIG. 14, package 1400 comprises substrate 1402 and dies 1404, 1406, and 1408 adhered to substrate 1402 via adhesive layers 1403, 1405, and 1407. Adhesive layer 1403 couples die 1404 to substrate 1402, adhesive layer 1405 couples die 1406 to die 1404, and adhesive layer 1407 couples die 1408 to die 1406. Dies 1404, 1406, and 1408 may be identical or distinct devices. Dies 1404, 1406, and 1408 are not limited in any way by their depiction in FIG. 14; there may be additional dies stacked amongst dies 1404, 1406, and 1408. Further, as shown in FIG. 14, die 1408 has a smaller footprint than die 1406, which in turn has a smaller footprint than die 1404. FIG. 14 illustrates only one embodiment of possible die arrangement. In other embodiments, die 1408 may have a larger or smaller footprint than die 1406, which may have a larger or smaller footprint than die 1404 or any other dies present in the stack.

This embodiment further comprises a plurality of bond wires 1418 electrically coupling dies 1404, 1406, and 1408 to substrate 1402, an encapsulant 1414, and one or more dummy blocks 1444 adhered to substrate 1402 via adhesive layer 1442. Dummy blocks 1444 are referred to as such because they require an adhesive layer 1442. Dummy blocks 1444 can be composed of a polymeric material or other materials commonly used in the semiconductor industry. The combination of dummy block 1444 and adhesive layer 1442 can control flow of molding compound 1414 during encapsulation, and thus can function as a flow controller. Alternatively, dummy block 1444 can be coupled to yet another material, which would perform flow controlling functions. The embodiment of FIG. 14 shows a single-layer dummy block 1444 coupled to adhesive layer 1442. Alternative embodiments can comprise a plurality of dummy block layers coupled to adhesive layer 1442. For example, the scope of possible embodiments encompasses the use of adhesive layer 1442 coupled to an interposer, which is in turn coupled to dummy block 1444, which is in turn coupled to a separate flow controller material. Additional layers can be added, or layers may be removed in various embodiments. The order of layers presented is not restrictive.

Dummy blocks 1444 are positioned adjacent to bond wires 1418, such that dummy blocks 1444 contact neither dies 1404, 1406, and 1408 nor bond wires 1418. Dummy blocks 1444 are coupled to substrate 1402, but do not pass under or around bond wires 1418. Adhesive layer 1442 may be applied adjacent to bond wires 1418 as illustrated in FIG. 14. Alternatively, adhesive layer 1442 may be applied so that it contacts substrate 1402, dies 1404, 1406, and 1408, as well as bond wires 1418. In this alternative embodiment, dummy block 1444 may still be positioned so that it does not contact dies 1404, 1406, and 1408, or bond wires 1418.

As seen in FIG. 14, the heights of dummy block 1444 and stacked dies 1404, 1406 and 1408 are substantially similar. However, in other embodiments, dummy block 1444 height can be selected for a particular purpose. As a result, in other embodiments, there is no particular height required for dummy block 1444, nor does its height need be substantially similar to the height of stacked dies 1404, 1406, and 1408. Further, FIG. 14 optionally can include a saw line such as saw line 1340, of FIG. 13.

Figure 15:
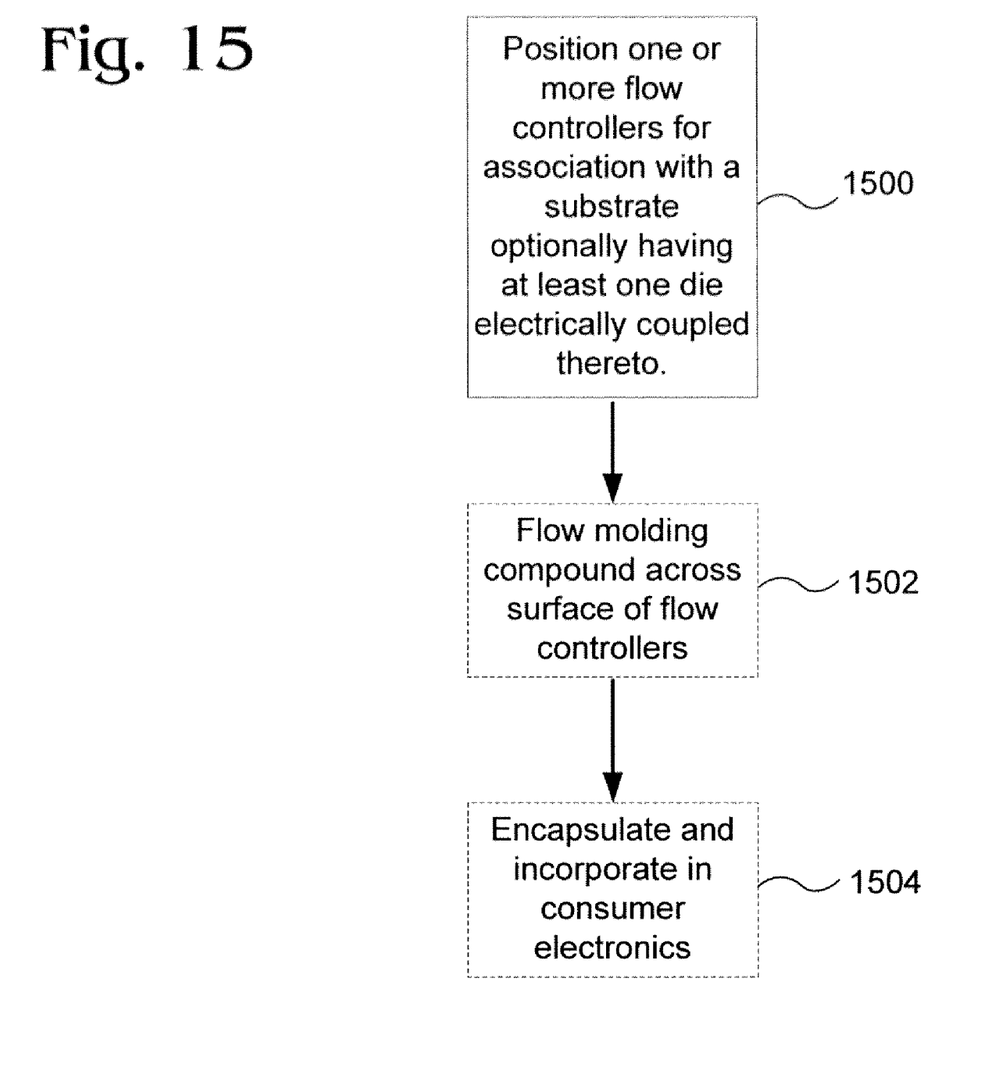
FIG. 15 is a flowchart of one embodiment of a method for making a semiconductor package.

FIG. 15 is a flowchart of one embodiment of a method for making a semiconductor package. One or more flow controllers can be positioned for association with a substrate optionally having at least one die electrically coupled thereto (step 1500). Flow controller volume, height, surface area, and/or shape can be selected to achieve the desired effect on molding compound flow. Flow controllers are made using any suitable material, including by way of example and without limitation, die adhesive, die coating material, polymeric material, screen printing material, solder paste, or combinations thereof. Flow controllers can comprise a non-insulating material. Positioning of flow controllers can be accomplished via epoxy dispensing and attach systems, epoxy dotting and attach systems, die coating, screen printing, or combinations thereof.

A molding compound is flowed over the surface of the substrate and flow controllers (step 1502). In some embodiments, flow controllers control molding compound flow, in order to provide a more uniform leading edge. Flow controllers also can decrease the flow rate relative to a package devoid of a flow controller or controllers. Once the semiconductor package has been encapsulated by molding compound, it can be incorporated into various electronic products (step 1504). A person of ordinary skill in the art will recognize that the order of steps as presented in FIG. 15 is not strictly limited to that order, and that other embodiments may reorder method steps.

Figure 16:
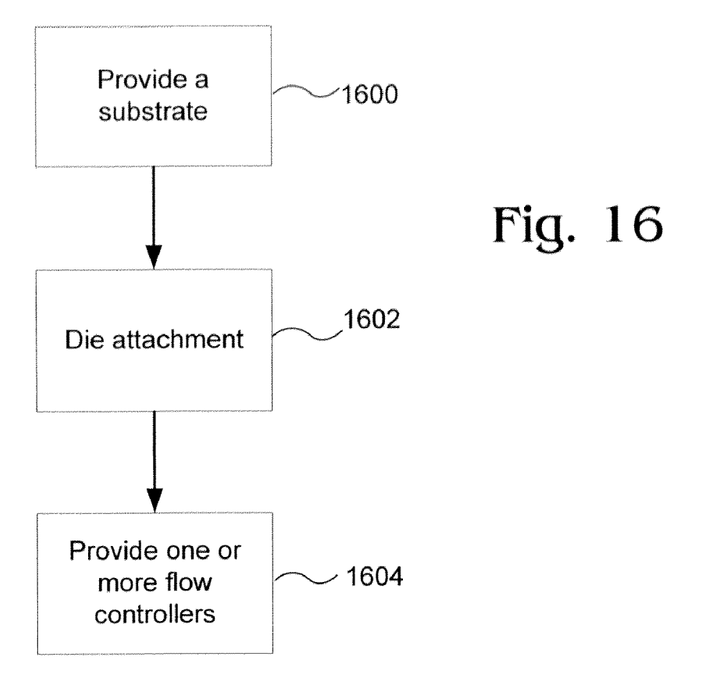
FIG. 16 is a flowchart of one embodiment of a method for providing flow controllers during semiconductor package manufacture.

FIG. 16 is a flowchart of one embodiment of a method for providing flow controllers during semiconductor package manufacture. A substrate can be provided (step 1600), and one or more dies can be attached or otherwise effectively coupled to the substrate (step 1602). Afterwards, one or more flow controllers can be provided (step 1604) and can be positioned as desired relative to other package components, such as the die or dies.

Figure 17:
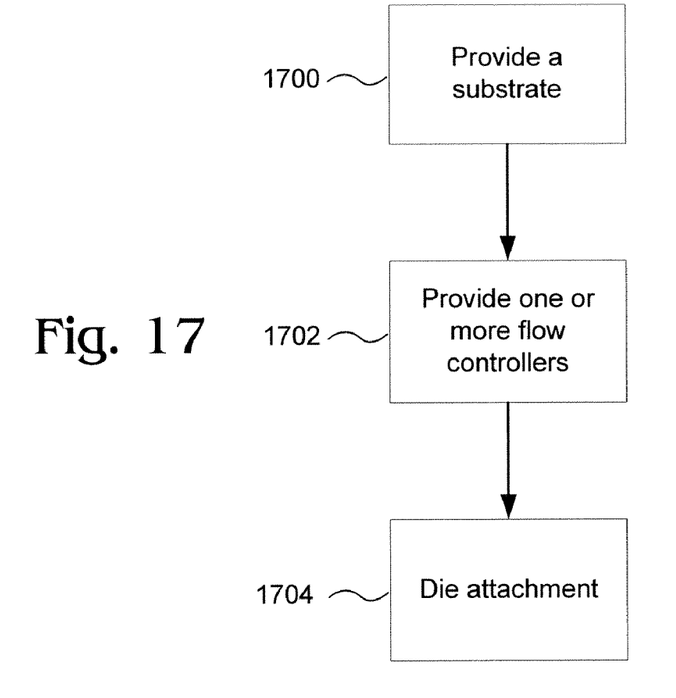
FIG. 17 is a flowchart of an alternative embodiment of a method for providing flow controllers during semiconductor package manufacture.

Alternatively, FIG. 17 is a flowchart of another embodiment of a method for using flow controllers for semiconductor package manufacture. A substrate can be provided (step 1700), and one or more flow controllers can be provided (step 1702) and attached or otherwise effectively coupled to the substrate before die attachment (step 1704).

Figure 18:
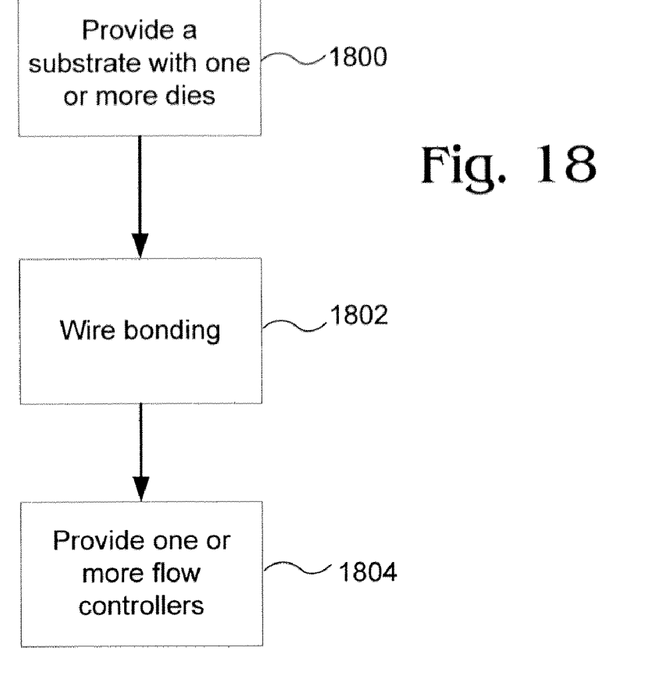
FIG. 18 is a flowchart of another alternative embodiment of a method for providing flow controllers during semiconductor package manufacture.

FIG. 18 is a flowchart of yet another embodiment of a method for using flow controllers to manufacture a semiconductor package. A substrate can be provided with one or more dies (step 1800). Wire bonding can be performed (step 1802) to electrically couple the dies to the substrate, followed by positioning of one or more flow controllers (step 1804).

Figure 19:
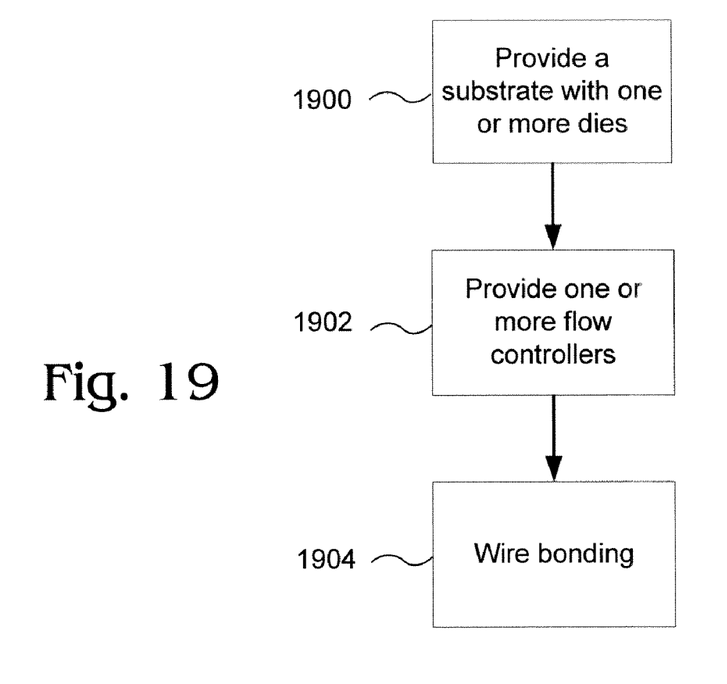
FIG. 19 is a flowchart of another alternative embodiment of a method for providing flow controllers during semiconductor package manufacture.

Alternatively, FIG. 19 is a flowchart of another embodiment of a method for using flow controllers to manufacture a semiconductor package. A substrate can be provided with one or more dies (step 1900). Flow controllers can be provided (step 1902) before wire bonding (step 1904) occurs.

Figure 20:
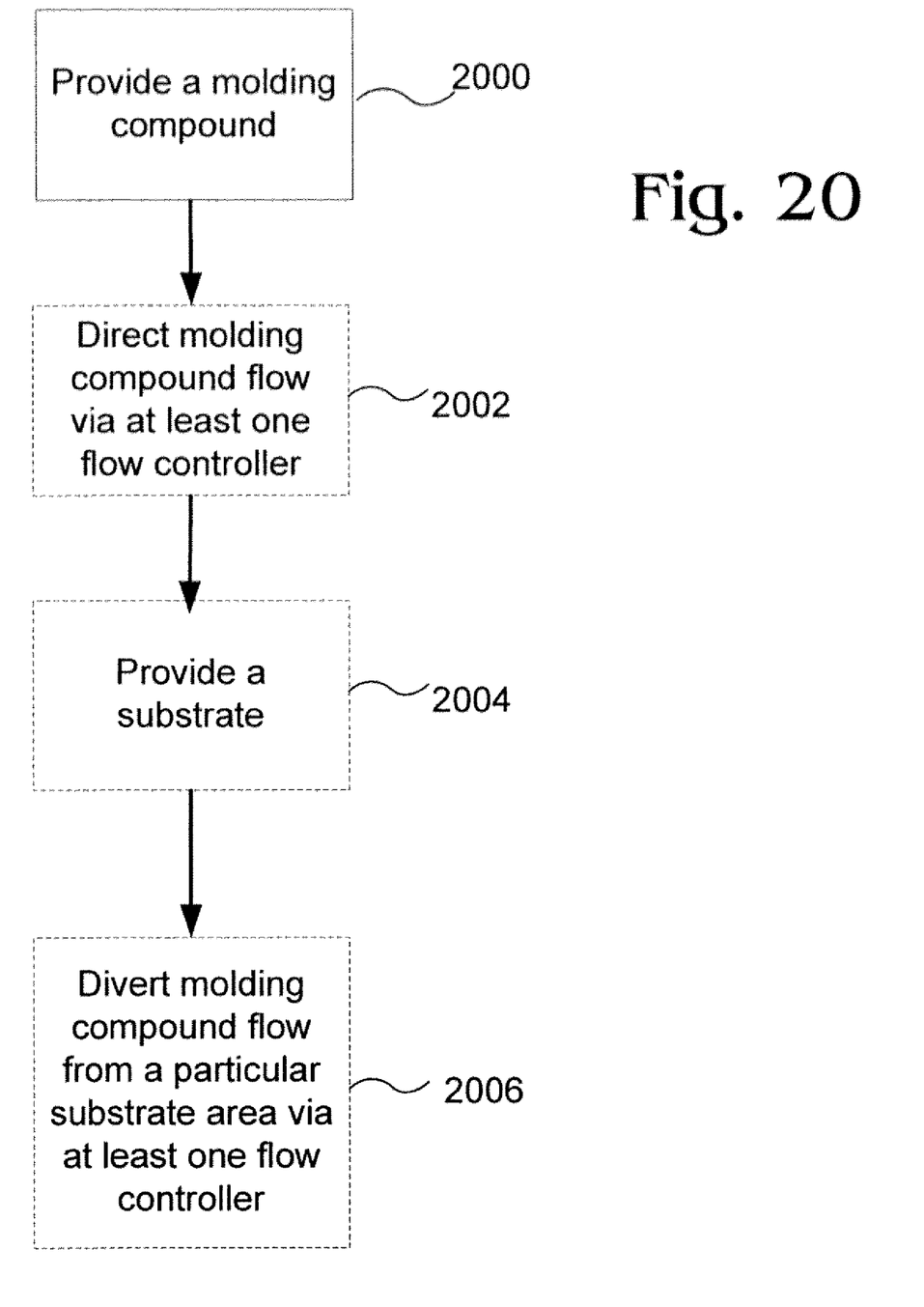
FIG. 20 is a flowchart of one embodiment of a method for directing molding compound flow.

FIG. 20 is a flowchart of one embodiment of a method for controlling molding compound flow. A molding compound can be provided (step 2000). Flow controllers can be positioned to direct molding compound flow in desired directions (step 2002). In another embodiment, a substrate can be provided (step 2004), and flow can be diverted away from certain areas of the substrate via flow controller placement (step 2006). A person of ordinary skill in the art will recognize that the order of steps as presented in FIG. 20 is not strictly limited to that order, and that other embodiments may reorder method steps.

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims. We therefore claim as our invention all that comes within the scope and spirit of these claims.

We claim:

1. A semiconductor package, comprising:
   a substrate;
   a die electrically coupled to the substrate by a plurality of bond wires; and
   a flow controller effectively sized and positioned to control flow of a molding compound over and/or around at least a portion of the substrate and/or the die, wherein the flow controller is located adjacent to and outside a perimeter defined by the plurality of bond wires.

2. The semiconductor package of claim 1, where the flow controller is positioned to control molding compound flow over all active components coupled to the substrate.

3. The semiconductor package of claim 1, further comprising plural dies, where at least a portion of the flow controller is positioned between adjacent dies.

4. The semiconductor package of claim 1, where the flow controller comprises die adhesive, die coating material, polymeric material, screen printing material, solder paste, or combinations thereof.

5. The semiconductor package of claim 1, where the flow controller comprises a non-insulating material.

6. The semiconductor package of claim 1, where the flow controller comprises:
  an adhesive layer coupled to a surface within the semiconductor package; and
  a dummy block coupled to the adhesive layer.

7. The semiconductor package of claim 1, further comprising plural dies.

8. The semiconductor package of claim 1, further comprising a passive component.

9. The semiconductor package of claim 1, where the flow controller is substantially cubic, rectangular, spherical, cylindrical, pyramidal, conical, amorphous, or combinations thereof.

10. The semiconductor package of claim 1, further comprising a molding compound, wherein the volume of the flow controller is from about $1 \times 10^{-3}$ cc to about a volume equal to a difference between molding compound volume and die volume.

11. The semiconductor package of claim 1, further comprising a molding compound, where flow controller volume is from about $1 \times 10^{-2}$ cc to about a volume equal to a difference between the molding compound volume and die volume.

12. The semiconductor package of claim 1, wherein the substrate comprises a semiconductor material, an insulating layer, a conducting material, or combinations thereof.

13. The semiconductor package of claim 1, further comprising a molding compound, where the semiconductor package is substantially devoid of sweeps, wire shorts, and internal and external voids in the molding compound.

14. The semiconductor package of claim 1, further comprising plural flow controllers.

15. The semiconductor package of claim 14, further comprising plural dies electrically coupled to the substrate.

16. The semiconductor package of claim 14, where at least a first flow controller is a different size, shape, and/or composition from at least a second flow controller.

17. The semiconductor package of claim 14, where a first flow controller is positioned independently of a second flow controller.

18. The semiconductor package of claim 1, further comprising a plurality of dies arrayed on the substrate.

19. The semiconductor package of claim 18, where the plurality of dies each comprises a single stack.

20. The semiconductor package of claim 18, where at least one of the dies comprises a multiple stack.

21. The semiconductor package of claim 18, further comprising a plurality of bond wires electrically coupling the dies to the substrate, where a flow controller comprises:
  an adhesive layer coupled to a surface within the semiconductor package; and
  a dummy block coupled to the adhesive layer.

22. The semiconductor package of claim 18, where a flow controller is located adjacent to and outside a perimeter defined by the array of dies.

23. The semiconductor package of claim 18, further comprising a plurality of bond wires electrically coupling the dies to the substrate, where the flow controller is a single integrated body contrasting the substrate, bond wires, and dies.

24. The semiconductor package of claim 23, further comprising:
  plural flow controllers; and
  at least one saw line indicating where the individual semiconductor packages are to be singulated;
  wherein each flow controller is located adjacent to, but does not continue over, the saw line.

25. The semiconductor package of claim 18, further comprising a plurality of bond wires electrically coupling the dies to the substrate, where a flow controller is located adjacent to a die stack, and does not contact the bond wires or the dies.

26. The semiconductor package of claim 18, further comprising a plurality of flow controllers, where each flow controller is positioned between adjacent die attach areas.

27. The semiconductor package of claim 18, where the flow controller has a height substantially the same as the die height.

28. The semiconductor package of claim 18, further comprising a molding compound, where the flow controller height is selected to optimize control of molding compound flow.

29. The semiconductor package of claim 18, further comprising a molding compound, where flow controller height is from greater than 0.0 microns to about the thickness of the molding compound.

30. A semiconductor package, comprising:
  a substrate;
  a die electrically coupled to the substrate;
  a flow controller effectively sized and positioned to control flow of a molding compound over at least a portion of at least one of the substrate and the die, and wherein the flow controller comprises an adhesive layer coupled to the substrate and a dummy block coupled to the adhesive layer; and
  a molding compound layer having a thickness at least as great as combined thicknesses of the adhesive layer and the dummy block.

31. The semiconductor package of claim 30, wherein the molding compound layer covers the flow controller.

32. A semiconductor package, comprising:
  a substrate comprising a planar substrate surface;
  a die electrically coupled to the planar substrate surface through a plurality of bond wires, the die comprising at least first and second opposing die edges;
  a first flow controller coupled to a first section of the planar substrate surface and located opposite the first opposing die edge; and
  a second flow controller coupled to a second section of the planar substrate surface and located opposite the second opposing die edge, wherein the first and second flow controllers are located outside a perimeter defined by the plurality of bond wires, and wherein the first and second flow controllers are configured to cause a mold compound to flow laterally around their respective sections of the planar substrate surface at substantially the same rate that the mold compound flows laterally over the die.

* * * * *